United States Patent
Yazzie et al.

(10) Patent No.: US 10,278,318 B2
(45) Date of Patent: Apr. 30, 2019

(54) METHOD OF ASSEMBLING AN ELECTRONIC COMPONENT USING A PROBE HAVING A FLUID THEREON

(71) Applicant: Intel Corporation, Santa Clara, CA (US)

(72) Inventors: Kyle Yazzie, Chandler, AZ (US); Pramod Malatkar, Chandler, AZ (US); Xiao Lu, Chandler, AZ (US); Daniel Chavez-Clemente, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 456 days.

(21) Appl. No.: 14/974,113

(22) Filed: Dec. 18, 2015

(65) Prior Publication Data
US 2017/0181339 A1   Jun. 22, 2017

(51) Int. Cl.
*H05K 13/04*   (2006.01)
*H05K 3/30*    (2006.01)

(52) U.S. Cl.
CPC ........ *H05K 13/0404* (2013.01); *H05K 3/30* (2013.01); *H05K 13/0408* (2013.01)

(58) Field of Classification Search
CPC .... H05K 13/00; H05K 13/0015; H05K 13/04; H05K 3/30; H05K 13/0404; H05K 13/0408

See application file for complete search history.

(56) References Cited

U.S. PATENT DOCUMENTS

| | | | | |
|---|---|---|---|---|
| 6,872,645 B2 * | 3/2005 | Duan | ...................... | B81C 3/005 257/1 |
| 6,969,690 B2 * | 11/2005 | Zhou | ...................... | B05D 1/185 430/5 |
| 7,814,648 B2 * | 10/2010 | Nakagawa | .............. | H01L 24/17 29/831 |

(Continued)

FOREIGN PATENT DOCUMENTS

| JP | 2005268705 A | * | 9/2005 |
|---|---|---|---|
| JP | 2007-073981 A | | 3/2007 |

(Continued)

OTHER PUBLICATIONS

"Surface Energy Calculations", from First Ten Angstroms, 465 Dinwiddie Street, Portsmouth, Virginia 23704, dated Sep. 13, 2001, pp. 1-2.

(Continued)

*Primary Examiner* — Carl Arbes
(74) *Attorney, Agent, or Firm* — Grossman, Tucker, Perreault & Pfleger, PLLC

(57) ABSTRACT

A method of assembly comprising providing an assembly probe, the assembly probe having an end coupling face; providing a droplet of fluid on the end coupling face of the assembly probe; coupling an electronic component to the end coupling face of the assembly probe with the fluid droplet, the electronic component having a peripheral dimension equal to or less than 2 mm in each of length, width and height; placing the electronic component on a substrate with the assembly probe; decoupling the electronic (Continued)

component from the end coupling face of the assembly probe; and assembling the electronic component to the substrate.

16 Claims, 10 Drawing Sheets

(56) References Cited

U.S. PATENT DOCUMENTS

| | | | | |
|---|---|---|---|---|
| 8,187,667 B2* | 5/2012 | Arase | ............ | H01L 24/95 |
| | | | | 29/831 |
| 8,394,458 B2* | 3/2013 | Arase | ............ | H01L 24/97 |
| | | | | 29/831 |
| 8,414,976 B2* | 4/2013 | Arase | ............ | H01L 24/95 |
| | | | | 29/592.1 |
| 8,656,582 B2* | 2/2014 | Lee | ............ | H01L 24/75 |
| | | | | 29/832 |
| 2002/0073536 A1* | 6/2002 | Okuda | ............ | H05K 13/0409 |
| | | | | 29/740 |
| 2006/0226013 A1* | 10/2006 | Decre | ............ | H01L 21/6835 |
| | | | | 204/601 |
| 2007/0175024 A1 | 8/2007 | Nakatani et al. | | |
| 2008/0086873 A1* | 4/2008 | Saitou | ............ | H05K 13/0408 |
| | | | | 29/743 |

FOREIGN PATENT DOCUMENTS

| | | |
|---|---|---|
| JP | 2008-118122 A | 5/2008 |
| JP | 2010-062293 A | 3/2010 |
| WO | 2004/055886 A2 * | 7/2004 |
| WO | 2004-055886 A2 | 7/2004 |

OTHER PUBLICATIONS

Lin et al., "Electrically tunable wettability of liquid crystal/polymer composite films", Optics Express, vol. 16, No. 22, published Oct. 16, 2008, 8 pages.

International Search Report and Written Opinion issued in PCT Application No. PCT/US2016/062571, dated Feb. 20, 2017, 13 pages.

Chaplin, Martin: "Magnetic and Electric Effects on Water", http://www.1.1sbu.ac.uk/water/magnetic_electric_effects.html, Apr. 13, 2017, pp. 1-6.

Lambert, P, et al.: "Surface Tension in Microsystems", http://www.Springer.com978-3-642-37551-4, dated 2013, 10 pages.

* cited by examiner

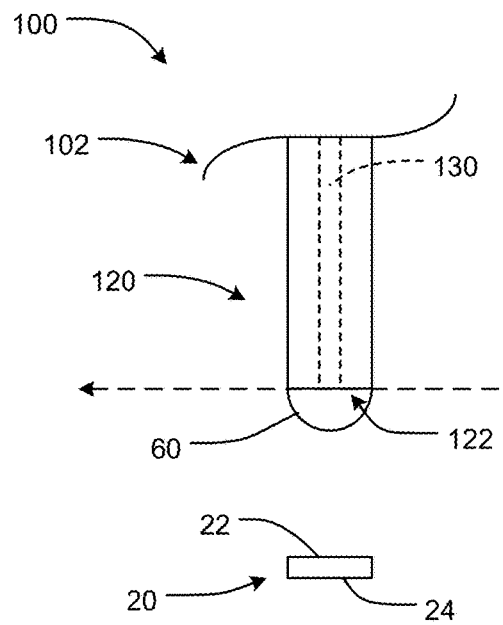 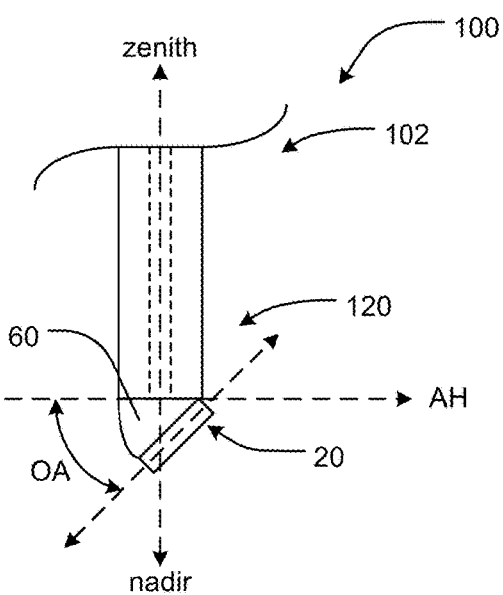
FIG. 2A  FIG. 2B
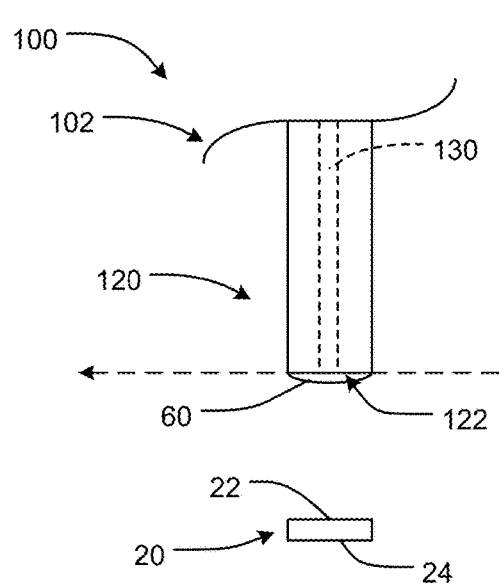 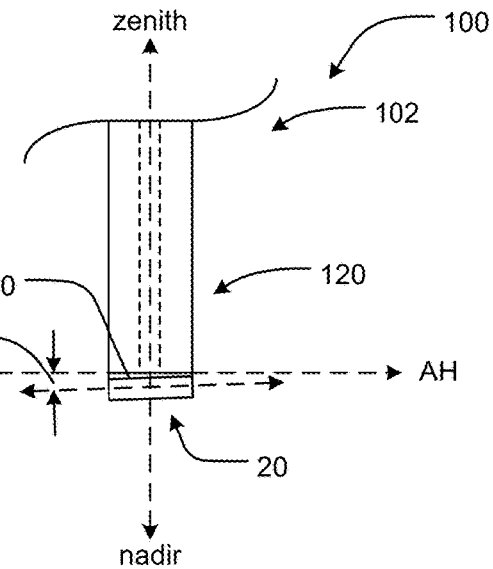
FIG. 2C  FIG. 2D

FIG. 3A
FIG. 3B
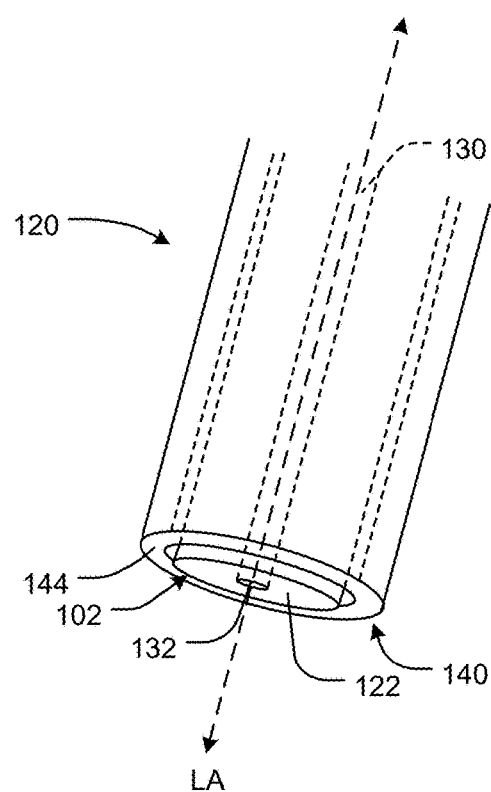
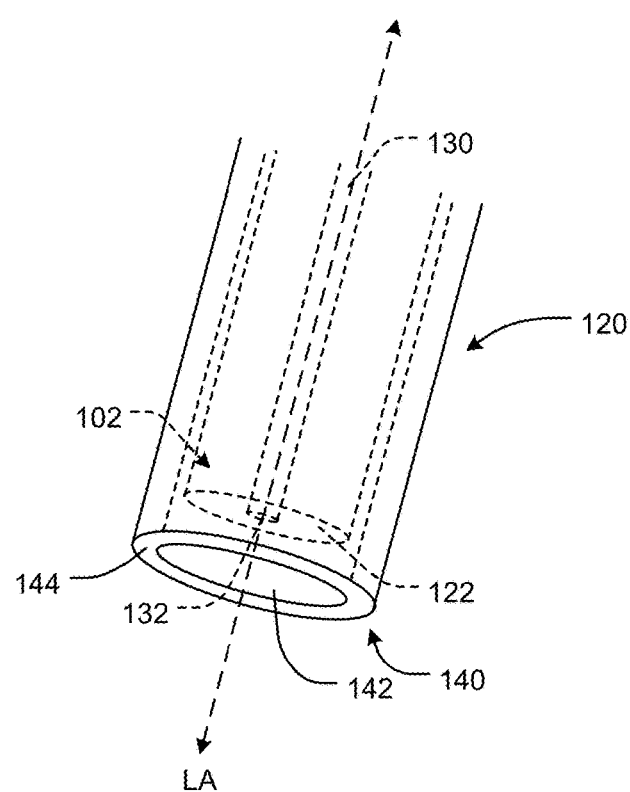

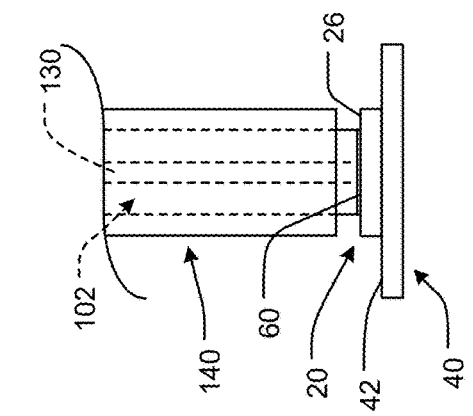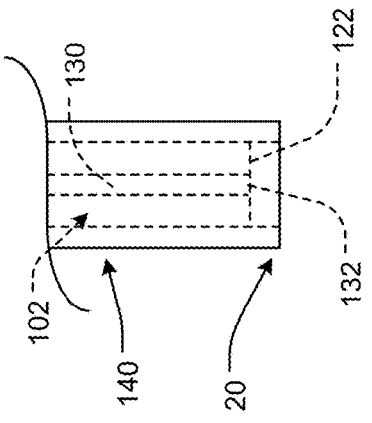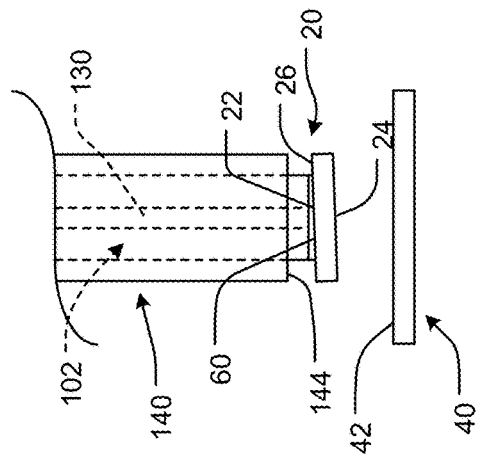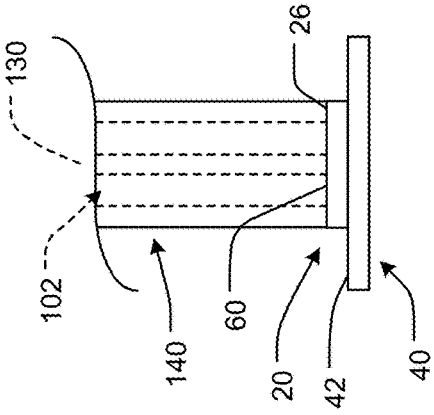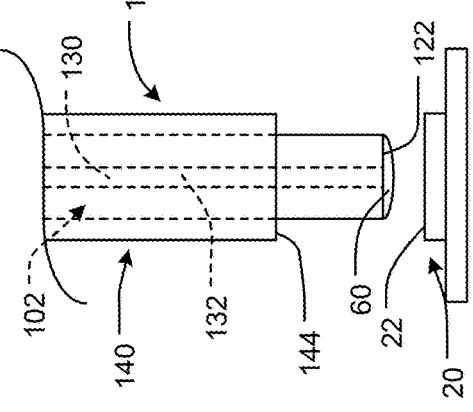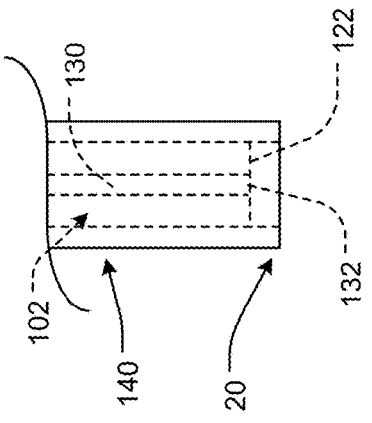

METHOD OF ASSEMBLING AN ELECTRONIC COMPONENT USING A PROBE HAVING A FLUID THEREON

FIELD

The present disclosure relates to the assembly of small components, such as electronic components, and more particularly to assembly probes utilizing a fluid to assemble the small components, as well as systems and methods of use thereof.

BACKGROUND

Assembly probes for pick and place assembly of electronic components often rely on mechanical grippers (i.e. devices which mechanically grab, squeeze, or pinch the components) or vacuum suction cups and collets. However, as electrical components become smaller, mechanical and vacuum assembly probes may become ill suited to effectively performing such tasks.

Mechanical grippers may be expensive to fabricate in increasingly smaller dimensions. In addition, regardless of size, mechanical grippers take up space when trying to place a small component in a tight location. Thus, even if mechanical grippers may be made small enough, they may not be easily maneuverable and may run into mechanical interference trying to access tight gaps, particularly due to the manner in which they grab the component. As such, spacing between the components for assembly may need to be increased, which is undesirable.

Mechanical grippers may also operate more slowly when handling small, delicate components, so that they have enough force rate control not to crush a component. This limitation decreases through put time.

Vacuum grippers may see a diminishing effective force as the area of the components they are picking up decreases, or if the components have irregular surfaces. As such, vacuum grippers may exert a very small force over small components, which may result in mis-picks, or the vacuum gripper not being able to pick up the component at all.

Recently, an ultra-small computational component has emerged in the industry which is referred to as a "mote". Motes are computational components that act as sensing systems, and are so small (e.g. <1 mm$^3$) as to resemble a mote of dust. Picking and placing the next generation of ultra-small computational components and other electronic components requires a pick and place probe which is suitable for use with such sized components.

FIGURES

The features of this disclosure, and the manner of attaining them, will become more apparent and better understood by reference to the following description of embodiments described herein taken in conjunction with the accompanying drawings, wherein:

FIG. 2A shows a distal end (tip) portion of an exemplary assembly probe according to the present disclosure with a large sized fluid coupling droplet thereon;

FIG. 2B shows the distal end (tip) portion of the exemplary assembly probe of FIG. 2A, with the large sized fluid coupling droplet coupled with a component to be assembled to a substrate, and an upper face of the component tilted at an orientation angle relative to an end coupling face of the distal end (tip) portion;

FIG. 2C shows the distal end (tip) portion of the exemplary assembly probe of FIG. 2A, with a small sized fluid coupling droplet thereon;

FIG. 2D shows the distal end (tip) portion of the exemplary assembly probe of FIG. 2A, with the small sized fluid coupling droplet coupled with a component to be assembled to the substrate, and the upper face of the component substantially parallel to the end coupling face of the distal end (tip) portion;

FIG. 3A shows a distal end (tip) portion of the exemplary assembly probe of FIG. 2A, which provides an inner member located within an outer member, and with an end coupling face of the inner member is positioned distally relative to an end face of the outer member;

FIG. 3B shows the distal end (tip) portion of the exemplary assembly probe of FIG. 3A, with the end coupling face of the inner member positioned proximally relative to the end face of the outer member;

FIG. 4A shows the distal end (tip) portion of the exemplary assembly probe of FIG. 3A, with the end coupling face of the inner member positioned distally relative to the end face of the outer member, and a fluid coupling droplet located thereon prior to coupling with a component to be assembled to a substrate;

FIG. 4B shows the distal end (tip) portion of the exemplary assembly probe of FIG. 3A, with the fluid coupling droplet on the end coupling face of the inner member coupled with the component to be assembled to the substrate, and the inner member retracted relative to the outer member to raise the component from a support platform;

FIG. 4C shows the distal end (tip) portion of the exemplary assembly probe of FIG. 3A, with the fluid coupling droplet on the end coupling face of the inner member coupled with the component to be assembled to the substrate, and the distal end (tip) portion of the assembly probe moved distally to lower the component onto (into contact with) the substrate;

FIG. 4D shows the distal end (tip) portion of the exemplary assembly probe of FIG. 3A, with the fluid coupling droplet on the end coupling face of the inner member coupled with the component to be assembled to the substrate, and the outer member moved distally such that the end face of the outer member is parallel with the end coupling face of the inner member;

FIG. 4E shows the distal end (tip) portion of the exemplary assembly probe of FIG. 3A, with the inner member moved proximally such that the end coupling face of the inner member is proximal relative to the end face of the outer member, and the fluid coupling droplet on the end coupling face of the inner member is decoupled from the component to be assembled to the substrate;

FIG. 4F shows the distal end (tip) portion of the exemplary assembly probe of FIG. 3A, with the inner member positioned proximally such that the end coupling face of the inner member is proximal relative to the end face of the outer member, after the distal end (tip) portion of the assembly probe of FIG. 3A is decoupled from the component;

Figure 6A:
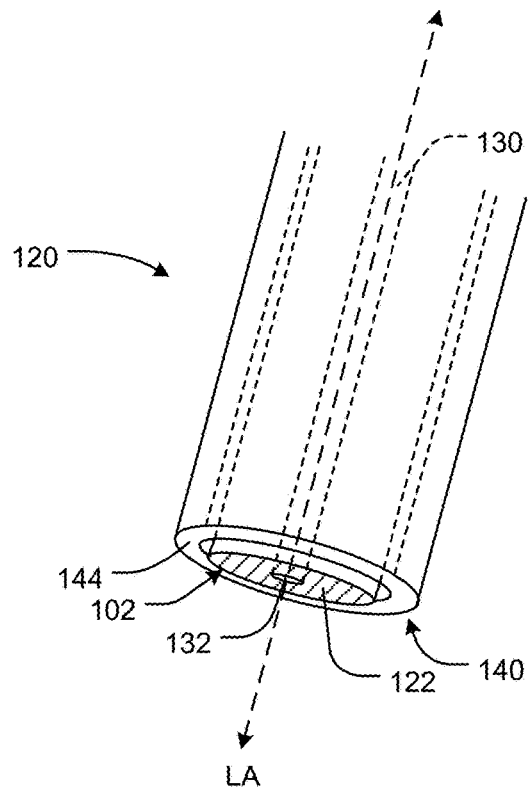
Figure 6B:
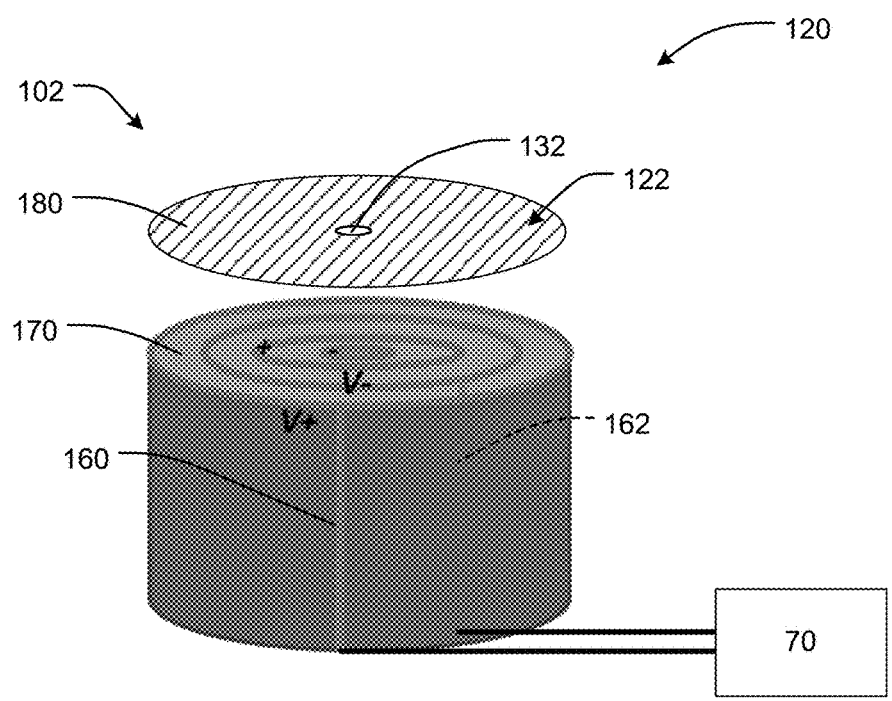
Figure 6C:
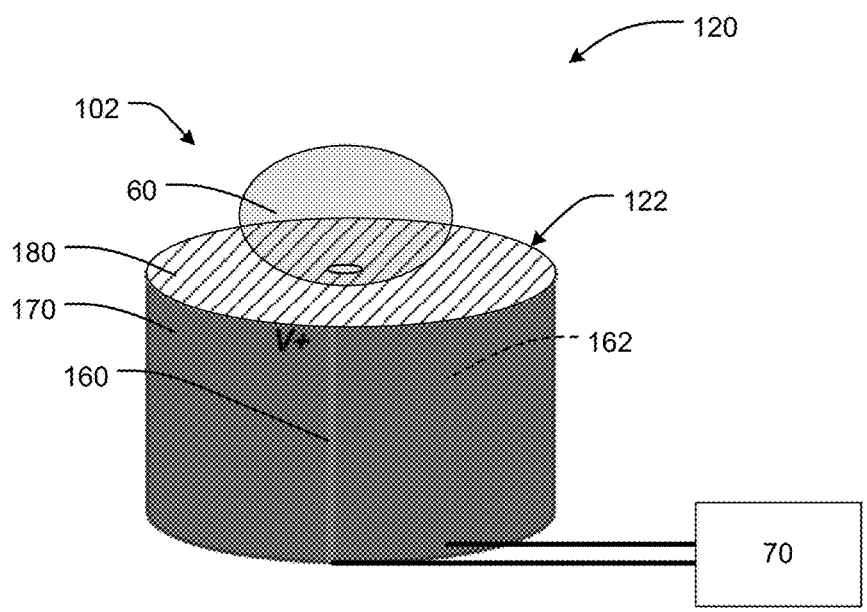
Figure 6D:
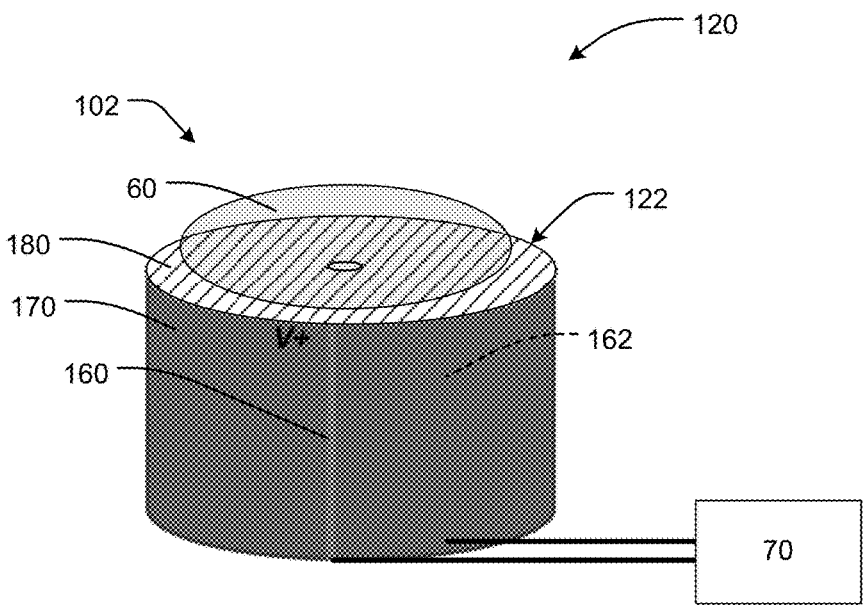
Figure 6E:
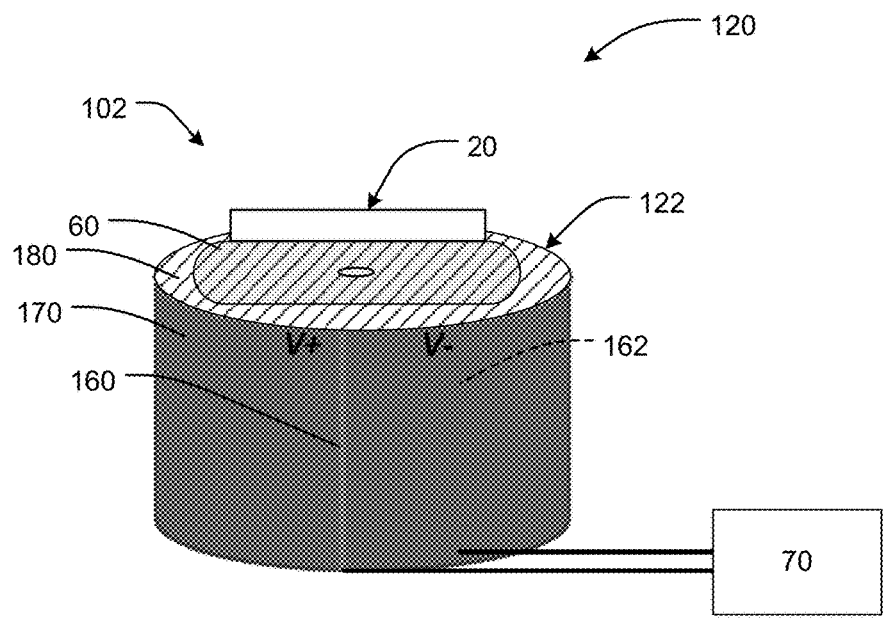
Figure 6F:
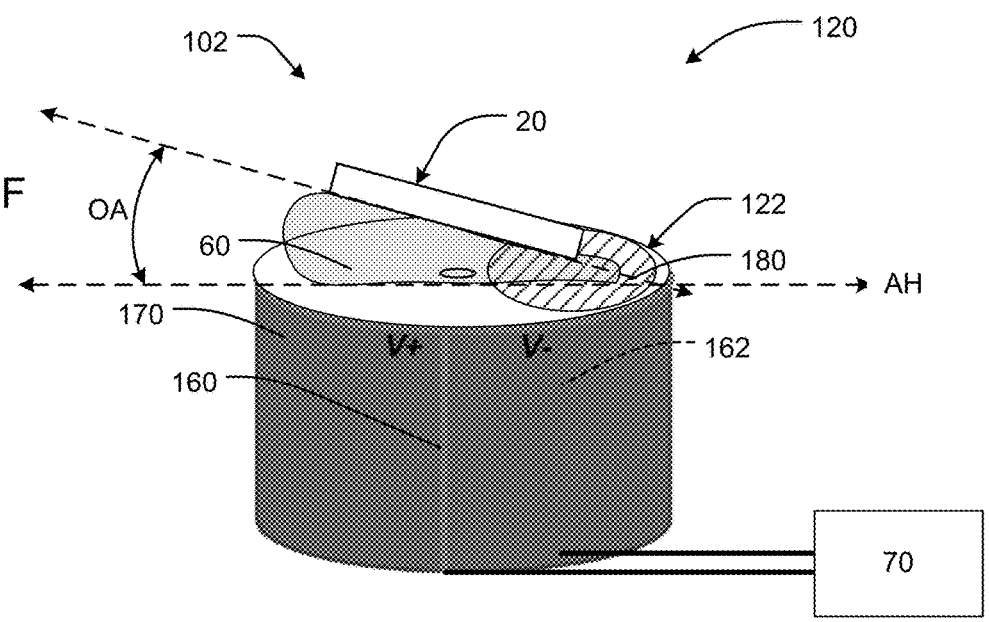
Figure 7A:
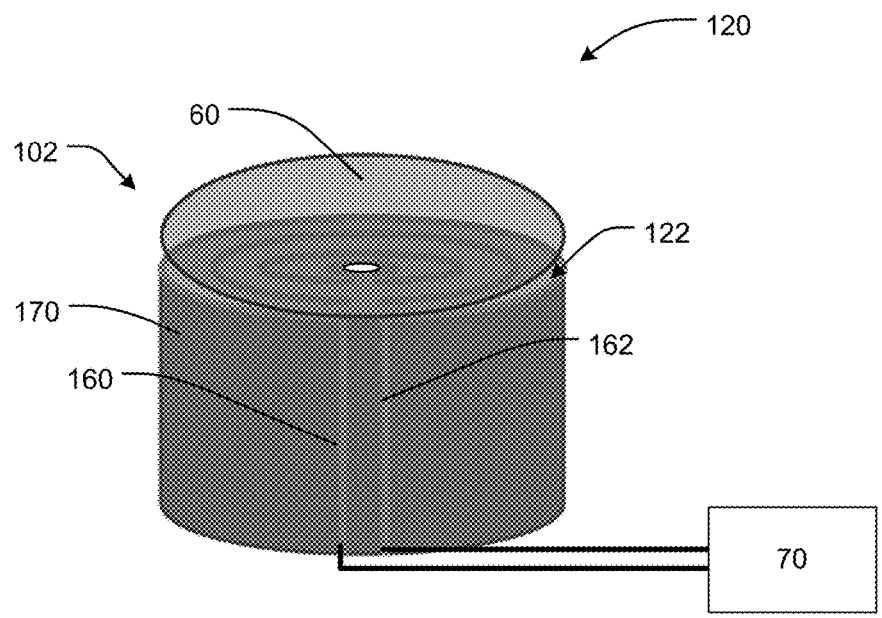
Figure 7B:
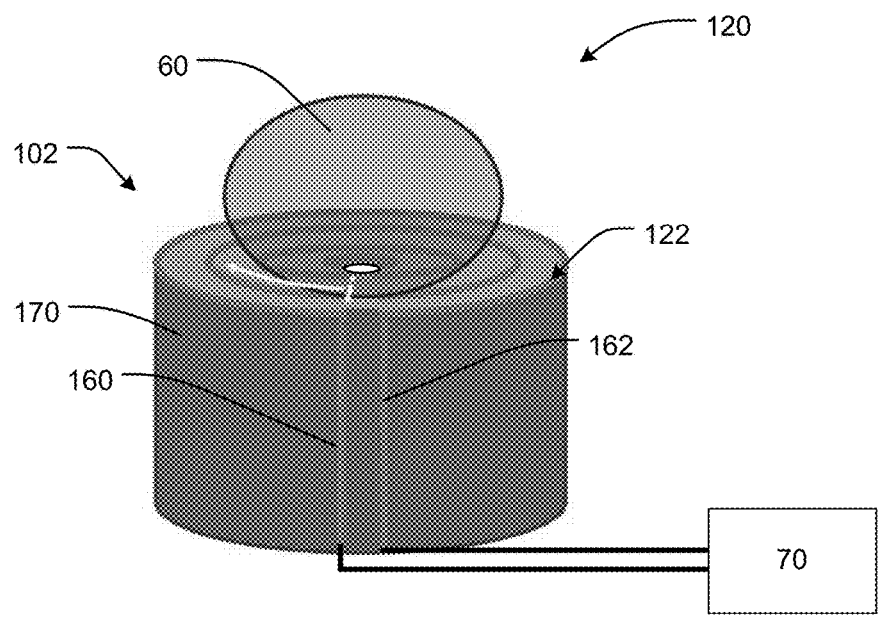
Figure 7C:
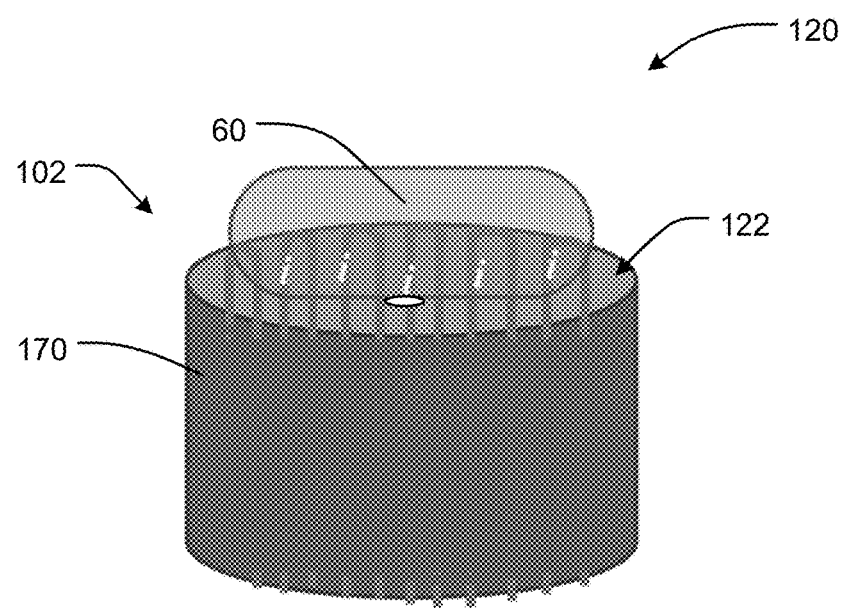
Figure 7D:
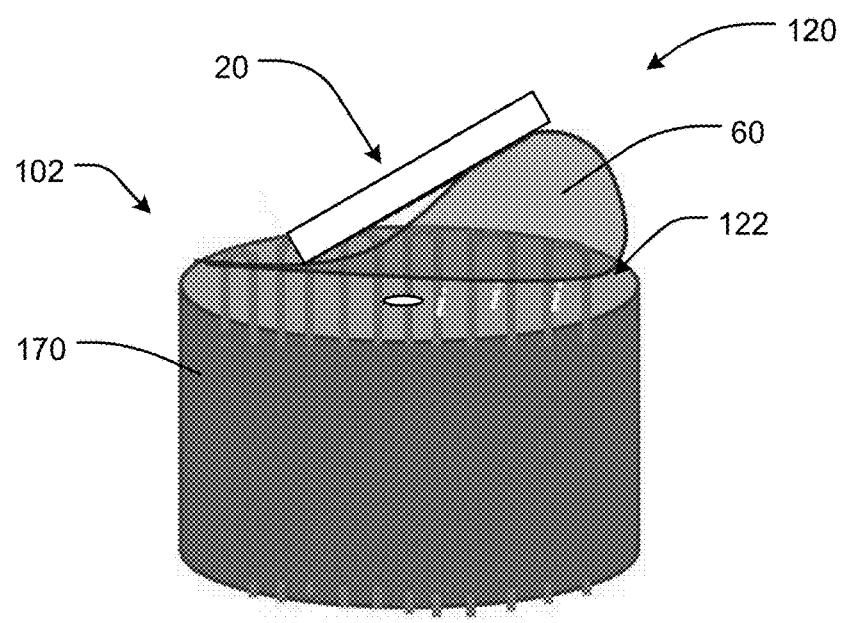

end face with the small sized (square) fluid coupling droplet coupled with a component to be assembled to a substrate;

FIG. 6A shows the distal end (tip) portion of the exemplary assembly probe of FIG. 3A, with the end coupling face of the inner member including a material composition which changes its surface wettability in a presence of an electrical field;

FIG. 6B shows an exploded close-up perspective view of the distal end (tip) portion of the exemplary assembly probe of FIG. 6A;

FIG. 6C shows a close-up perspective view of the distal end (tip) portion of the exemplary assembly probe of FIG. 6A, with a fluid coupling droplet located thereon prior to an electric field being provided to end coupling face of the inner member;

FIG. 6D shows a close-up perspective view of the distal end (tip) portion of the exemplary assembly probe of FIG. 6A, with a fluid coupling droplet located thereon while an electric field is being provided to end coupling face of the inner member;

FIG. 6E shows a close-up perspective view of the distal end (tip) portion of the exemplary assembly probe of FIG. 6A with a fluid coupling droplet and component located thereon while an electric field is being provided to end coupling face of the inner member in a manner which orientates the component substantially parallel to the end coupling face of the distal end (tip) portion;

FIG. 6F shows a close-up perspective view of the distal end (tip) portion of the exemplary assembly probe of FIG. 6A with a fluid coupling droplet and component located thereon while an electric field is being provided to end coupling face of the inner member in a manner which orientates the component an orientation angle to the end coupling face of the distal end (tip) portion;

FIG. 7A shows a close-up perspective view of the distal end (tip) portion of the exemplary assembly probe of FIG. 3A, with a ferrofluid coupling droplet located thereon prior to a magnetic field being provided to end coupling face of the inner member;

FIG. 7B shows a close-up perspective view of the distal end (tip) portion of the exemplary assembly probe of FIG. 7A, with the ferrofluid coupling droplet located thereon while a magnetic field is being provided to end coupling face of the inner member;

FIG. 7C shows a close-up perspective view of the distal end (tip) portion of the exemplary assembly probe of FIG. 7A with a ferrofluid coupling droplet and component located thereon while a magnetic field is being provided to end coupling face of the inner member in a manner which orientates the component substantially parallel to the end coupling face of the distal end (tip) portion; and FIG. 7D shows a close-up perspective view of the distal end (tip) portion of the exemplary assembly probe of FIG. 7A with a ferrofluid coupling droplet and component located thereon while a magnetic field is being provided to end coupling face of the inner member in a manner which orientates the component an orientation angle to the end coupling face of the distal end (tip) portion.

DETAILED DESCRIPTION

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

The present disclosure relates to the assembly of small components, such as electronic components, and more particularly to assembly probes (e.g. pick and place) utilizing a fluid to assemble the small components, as well as systems and methods of use thereof.

Figure 1:
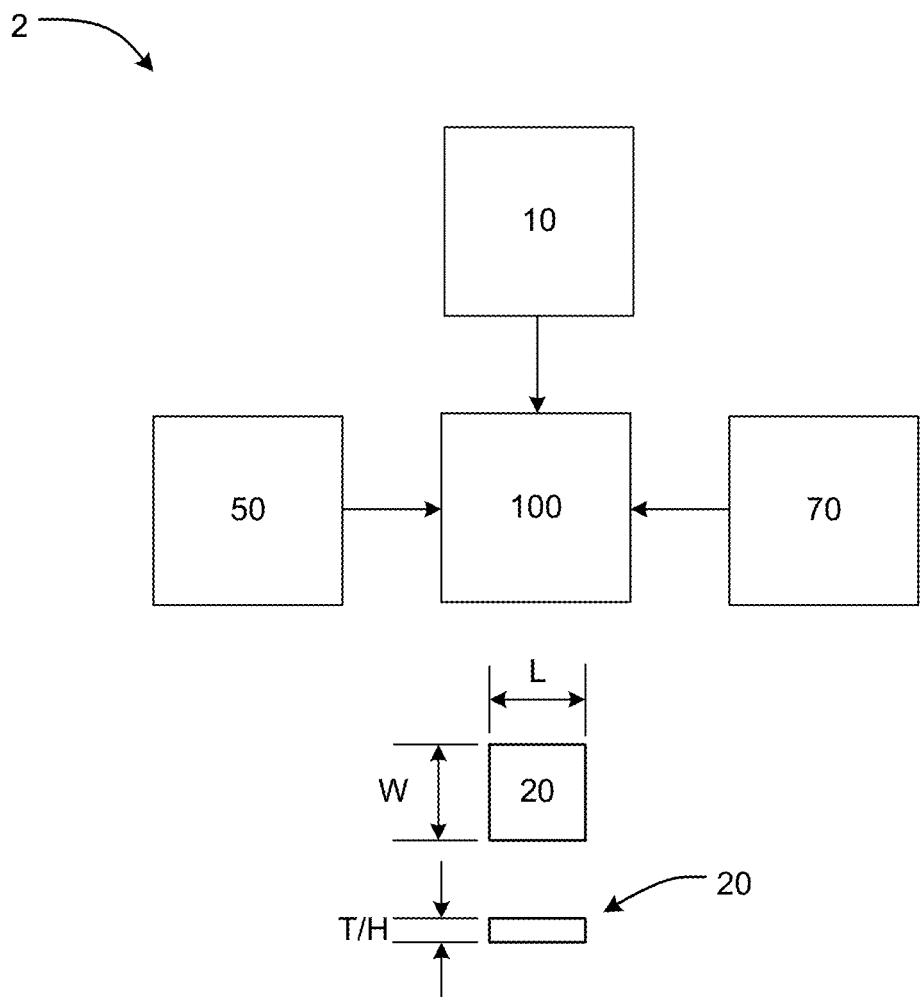
FIG. 1 shows an exemplary assembly system which utilizes an assembly probe according to the present disclosure, as well as the methods of use thereof.

Referring now to FIG. 1, there is shown an assembly system/apparatus 2, comprising an assembly probe 100 to assemble a component 20 to a substrate 40 (shown in FIGS. 4A-4E). As shown, the assembly probe 100 may by manipulated by an electro-mechanical manipulator 10, such as a multi-axis robot, which may include a non-transitory computer-readable medium having a plurality of instructions encoded thereon that when executed by at least one processor cause the process methods described herein to be performed. As shown, and explained in greater detail herein, the assembly probe may be coupled to a fluid source 50, as well as an electrical power source 70 to generate an electric field and/or a magnetic field as used herein.

Component 20 may particularly be an electronic component having a peripheral dimension equal to or less than 2 mm in each of length L, width W and thickness T (alternatively height H), or a surface area of 4 $mm^2$ or less, which may be provided by length and width dimensions of 2 mm or less (e.g. 0.1 mm to 2 mm). More particularly, component 20 may particularly be an electronic component having a peripheral dimension equal to or less than 1 mm in each of length L, width W and thickness T (alternatively height H), or a surface area of 1 $mm^2$ or less, which may be provided by length and width dimensions of 1 mm or less (0.1 mm to 1 mm).

An exemplary electronic component may comprise a computational component (e.g. mote) and an integrated circuit die. Exemplary electronic components may also include passive components such as capacitors, MEMs devices, microlenses and magnets.

An exemplary substrate 40 may comprise a printed circuit board (PCB), as well as substrates made of metal (steel), such as stiffeners, metalloid (e.g. silicon), glass or ceramic.

Referring to FIGS. 2A-2D, there is shown a fluid coupling droplet 60, particularly formed of liquid such as water, attached to end coupling face 122 of distal end (tip) portion 120 of elongated member 102 of assembly probe 100. The fluid coupling droplet 60 may be placed on the end coupling face 122 by inserting/dipping the distal end (tip) portion 120 of elongated member 102 in the fluid (e.g. water) source 50 and thereafter removing the distal end (tip) portion 120 of elongated member 102 from the fluid source 50 in a known manner.

Alternatively, fluid may be provided through a fluid passage (e.g. lumen) 130 and expelled/discharged out a fluid outlet 132 (better shown in FIGS. 3A-3B) provided within the member 102 from the fluid (e.g. water) source 50, in which case the elongated member 102 may be understood to be tubular. As such, the assembly probe 100 may include at least one fluid passage 130 coupled to at least one fluid outlet 132 arranged to provide the fluid coupling droplet 60 of fluid on the end coupling face 122 of the assembly probe 100.

Thus, the assembly probes 100 of the present disclosure may operate by utilizing a localized fluid coupling droplet 60 located on an end coupling face 122 of the assembly probe 100, which may then be used to provide a fluid coupling to retain component 20 thereto, particularly via capillary force. Capillary force provides an effective mechanism for lifting small components, particularly as the capillary force becomes dominant as the small components decrease in size and weight, and the capillary force surpasses gravity force (See "Surface Tension in Microsystems: Engineering Below the Capillary Length"—Edited by Pierre Lambert).

More particularly, end coupling face 122 is used to couple to and hold component 20 via capillary force provided by fluid coupling droplet 60, which is located between the end coupling face 122 and the component 20. As such, probe 100 may couple to and hold a component 20 without mechanical gripping or vacuum gripping.

The end coupling face 122 (as well as component 20) should have good wettability with the fluid, and the fluid coupling droplet 60 thereon preferably should not form beads thereon with a contact angle θ greater than 90 degrees. Contact angle, θ, is a quantitative measure of the wetting of a solid by a liquid. It is defined geometrically as the angle formed by a liquid at the three phase boundary where a liquid, gas and solid intersect. In terms of the thermodynamics of the materials involved, contact angle θ involves the interfacial free energies between the three phases given by the equation $\gamma_{LV} \cos\theta = \gamma_{SV} - \gamma_{SL}$ where $\gamma_{LV}$, $\gamma_{SV}$, and $\gamma_{SL}$ refer to the interfacial energies of the liquid/vapor, solid/vapor and solid/liquid interfaces, respectively. If the contact angle θ is greater than 90 degrees the liquid is non-wetting. If the contact angle θ is less than 90 degrees the liquid is said to wet the solid. A contact angle θ equal to zero represents complete wetting. Thus, preferably the contact angle is less than 90 degrees. The contact angle may, for example, be in a range of 0-90 degrees, and more particularly in a range of 0-60 degrees, and even more particularly in a range of 0-45 degrees.

While it is known that the contact angle θ may be defined by the preceding equation, in reality contact angle θ is determined by a various models. Five models which may be used to determine contact angle θ include the following: (1) Zisman critical wetting tension; (2) Girifalco, Good, Fowkes, Young combining rule; (3) Owens, Wendt geometric mean; (4) Wu harmonic mean; and (5) Lewis acid/base theory. According to the publication entitled "Surface Energy Calculations" (dated Sep. 13, 2001) from First Ten Angstroms (465 Dinwiddie Street, Portsmouth, Va. 23704), there can be a 25% difference in the answers provided for the contact angle θ by the foregoing models. For clarification, anyone of the five models above which calculates a contact angle θ within a particular range of contact angles θ or the contact angle θ required of a particular embodiment of the disclosure (or a claim) should be considered as fulfilling the requirements of the embodiment, even if the remaining four models calculate a contact angle θ which does not fulfill the requirements of the embodiment.

While wetting of the end coupling face 122 with the fluid may better increase retention of a component thereto via capillary force, a fluid coupling droplet 60 on the end coupling surface 122 should also exhibit a Bond Number of less than one. The effects of gravity and surface tension of the fluid coupling droplet 60 located on end coupling face 122 may be modeled by the Bond number $N_{BO}$. Bond umber $N_{BO}$ may be understood to measure the relationship of gravitational forces to surface tension forces and may be expressed as:

$N_{BO}$=gravitational force/surface tension force $NBo = \rho L^2 g / \sigma$ where: ρ=density of the fluid;
L=droplet diameter
g=gravitational acceleration
σ=surface tension of fluid As explained in greater detail herein, in order to take hold of a component 20, the end coupling face 122 with the fluid coupling droplet 60 contacts against the component 20. Similar to the end coupling face 122 of assembly probe 100, the component face 22 should have good wettability with the fluid, and the fluid coupling droplet 60 thereon preferably should not form beads thereon with a contact angle θ greater than 90 degrees. The component face 22 (as well as the end coupling face 122 of the assembly probe 100) can be treated with reagents to make it more wettable with the fluid (e.g. hydrophilic surface treatment for an aqueous fluid, plasma treatment). In certain instances, such may be accomplished by a simple spray and wash application.

As such, a capillary force gripper as provided by the present disclosure does not necessarily need to exert a significant capillary force to pick and place a component 20. The fluid that is used may be tailored to create a stronger or weaker capillary force by changing the surface characteristics (e.g. wetting characteristics) of the end coupling face 122 of the assembly probe 100 and/or the face 22 of the component 20, as well as the fluid.

In the embodiment illustrated, elongated member 102, including distal end portion 120, may be formed of metal, such as aluminum. As shown, elongated member 102, including distal end portion 120, is cylindrical and the end coupling face 122 of distal end (tip) portion 120 is a planar and circular.

FIGS. 2A-2D illustrate how the size of the fluid coupling droplet 60 may be used to add a gimbaling action to tilt component 20, without the need for complicated, miniaturized mechanical gimbals or yokes.

In FIGS. 2A-2B, a rather large fluid coupling droplet 60 of water is shown, which results in the component 20 being tilted relative to the astronomical horizon AH, which may be understood as a horizontal reference plane. For the purposes of this disclosure the astronomical horizon AH may be understood to be orthogonal (perpendicular) to nadir and zenith. Nadir at a given location may be understood as the local vertical direction pointing in the direction of the force of gravity at that location (0 degrees), while the direction opposite of the nadir is the zenith (180 degrees).

With a large fluid coupling droplet 60, component 20 may be tilted such that the coupling upper face 22 and/or lower face 24 of the component 20, which may also be understood as first and second opposing faces of the component 20, are orientated at an orientation angle OA in a range of 10 degrees to 45 degrees from the astronomical horizon AH, while the end coupling face 122 of the distal end (tip) portion 120 is orientated parallel to the astronomical horizon AH. As shown in FIG. 2B, the upper face 22 and lower face 24 of the component 20 are orientated at an orientation angle OA of 45 degrees from the astronomical horizon AH.

In FIGS. 2C-2D, a smaller fluid coupling droplet 60 is used to retain the same component 20. Due to the decreased size of the fluid coupling droplet 60, the component 20 may be tilted such that the upper face 22 and/or lower face 24 of the component 20 is orientated at an orientation angle OA in a range of 0 degrees to 9 degrees from the astronomical horizon AH, while the end coupling face 122 of the distal end (tip) portion 120 is orientated parallel to the astronomical horizon AH. As shown in FIG. 2D, the upper face 22 and lower face 24 of the component 20 are orientated at an orientation angle OA of 2 degrees from the astronomical horizon AH. Stated another way, when the upper face 22 and/or lower face 24 of the component 20 is orientated at an orientation angle OA in a range of 0 degrees to 9 degrees from the astronomical horizon AH, the upper face 22 and/or lower face 24 of the component 20 may be understood to be substantially parallel to the end coupling face 122 of the distal end (tip) portion 120, or substantially horizontal to the astronomical horizon AH.

Thus, in certain embodiments, after a component 20 is coupled to the end coupling face 122 of the assembly probe 100 with the fluid coupling droplet 60, the orientation of the component 20 on the assembly probe 100 may be changed prior to placing the component 20 on a substrate 40. For example, changing the orientation of the component 20 on the assembly probe 100 may be performed at least in part by changing a size of the of the fluid coupling droplet 60 on the end coupling face 122 of the assembly probe 100. More particularly, changing the size of the fluid coupling droplet 60 on the end coupling face 122 of the assembly probe 100 comprises increasing the size of the fluid coupling droplet 60 by adding fluid to the fluid coupling droplet 60, particularly through fluid passage 130. Tilting the component 20 may be desirable in order to insert the component 20 into a particularly narrow location for assembly to substrate 40.

In order to remove the component 20 from the end coupling face 122 of the elongated member 102 once the component 20 has been placed on a substrate 40, the system may be configured such that the fluid coupling droplet 60 evaporates in a time period slightly longer (e.g. 1 to 10 seconds) than the time required to pick and place the component 20 on the substrate 40. Once the fluid forming the fluid coupling droplet 60 has evaporated, the component 20 may no longer be retained on the end coupling face 122 as the capillary force retaining the component 20 is no longer present. As such, the probe 100 may be lifted and withdrawn from the assembly site without fear of disturbing the positioning of the component 20 on the substrate 40.

Alternatively, as shown in FIGS. 3A-3B in order to remove the component 20 from the end coupling face 122 once the component 20 has been placed on a substrate 40, the distal end (tip) portion 120 may include an outer annular (tubular) elongated member 140 which surrounds elongated member 102, in which case elongated member 102 now may more properly be referred to as inner elongated member 102, which is located within the tubular passage/lumen 142 of the outer annular elongated member 140. Outer annular elongated member 140 may be understood to provide a collar or a sheath around the inner elongated member 102. In addition, inner elongated member 102 may be referred to as a first elongated member, while outer annular elongated member 140 may be referred to as a second elongated member.

As shown the inner elongated member 102 and the outer annular elongated member 140 may both be cylindrical. The outer elongated member 140 may actuate and move longitudinally relative to the inner elongated member 102 (or vice versa) along a longitudinal axis LA of the distal end (tip) portion 120, such as by retracting proximally or extending distally relative to a proximal end portion 110 of the probe 100, which may be connected to a probe manipulator 10, such as an assembly robot.

Referring now to FIGS. 4A-4F, and more particularly FIG. 4A, prior to coupling to a rectangular component 20, and more particularly a square component 20 (e.g. 2 mm×2 mm), the end face 144 of the outer elongated member 140 may be positioned proximal (retracted) or parallel with the end coupling face 122 of the inner elongated member 102. The fluid coupling droplet 60 may be provided solely on the end coupling face 122 of the inner elongated member 102.

In order to couple the component 20 to the end coupling face 122 of the inner elongated member 102, the inner elongated member 102 of the probe 100 may be extended vertically downwards towards the component 20, and/or the component 20 may be placed on a support platform 90 which moves vertically upward.

Referring now to FIG. 4B, as shown, the component 20 is coupled with the fluid coupling droplet 60 and moved vertically upward, particularly by retracting the inner elongated member 102 of the probe 100 vertically upwards. Also as shown, the surface area of the component 20 is larger than the surface area of the end coupling face 122 of the inner elongated member 102 such that the component 20 overhangs the inner elongated member 102, thus creating a lip 26.

Referring now to FIG. 4C, the component 20 is shown being placed on the substrate 40. Thereafter, as shown in FIG. 4D, the outer elongated member 140 is moved distally relative to the inner elongated member 102. In doing so, the end face 144 of the outer elongated member 140 makes contact with the lip 26 of the component 20.

Referring now to FIG. 4E, the outer elongated member 140 may be continued to be moved distally relative to the inner elongated member 102 and/or the inner elongated member 102 may be moved proximally relative to the outer elongated member 142. This causes the end face 144 of the outer elongated member 140 and the end coupling face 122 of the inner elongated member 102 to separate and grow further apart longitudinally. As a result, the component 20 may be decoupled from the distal end (tip) portion 120 by being pushed and/or pulled off the end coupling face 122 (depending on whether the outer elongated member 140 moves relative to the inner elongated member 102, the inner elongated member 102 moves relative to the outer elongated member 140 or both) in a manner which overcomes the capillary force provided by the fluid coupling droplet 60.

FIG. 4F shows the relative positions of the inner elongated member 102 and the outer elongated member 140 of the probe 100 after the component 20 has been decoupled. Thus, when the component 20 decouples from the distal end (tip) portion 120, such may result from: (1) the fluid coupling droplet 60 separating only from the component 20 and remaining completely on the end coupling face 122 of the inner elongated member 102; (2) the fluid coupling droplet 60 separating only from the end coupling face 122 of the inner elongated member 102 and remaining completely on the component 20; or (3) the fluid coupling droplet 60 breaking apart, with a residue portion of the fluid coupling droplet 60 remaining on the end coupling face 122 of the inner elongated member 102 and another residue portion of the fluid coupling droplet 60 remaining on the upper face 22 of the component 20. In certain embodiments, decoupling may also result from evaporation of the fluid coupling droplet 60.

As such, decoupling the component 20 from the end coupling face 122 of the assembly probe 100 may include at least one of separating the fluid coupling droplet 60 from the end coupling face 122 of the assembly probe 100, separating the fluid coupling droplet 60 from the component 20, separating the fluid coupling droplet 60 into a first portion coupled to the end coupling face of the assembly probe and a second portion coupled to the component 20, and at least partially evaporating the fluid coupling droplet 60.

Depending on the overall size of the fluid coupling droplet 60 remaining on the end coupling face 122 of the inner elongated member 102, and the evaporation rate of the fluid thereof, once the component 60 decoupled from the end coupling face 122 of the inner elongated member 102, it may be necessary to reapply fluid to the end coupling face 122 to provide a fluid coupling droplet 60 to assemble the next component 20. Such may be necessary for every cycle.

Figure 5A:
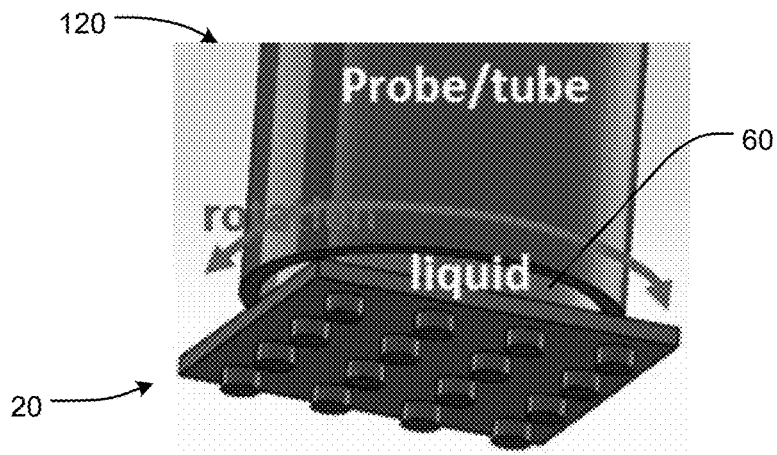
FIG. 5A shows a distal end (tip) portion of the exemplary assembly probe of FIG. 3A, with the small sized fluid coupling droplet coupled with a component to be assembled to a substrate.

Referring to FIG. 5A, when elongated member 102, and more particularly the end coupling face 122 of distal end (tip) portion 120 is circular, i.e. does not have any linear peripheral side edges or corners, the component 20 may rotate about the longitudinal axis LA of the distal end (tip) portion 120. Without being bound to a particular theory, such may occur, for example, when the fluid coupling droplet 60 is not perfectly centered on the component 20, causing one portion of the fluid coupling droplet 60 to bear more weight than another portion. Such may also occur if, when the component 20 is first coupled to the fluid coupling droplet 60, the upper face 22 of the component 20 and the end coupling face 122 of distal end (tip) portion 120 are not perfectly parallel, resulting in an uneven distribution of fluid between the upper face 22 of the component 20 and the end coupling face 122 of distal end (tip) portion 120. As a result, the component 20 may rotate until the fluid coupling droplet 60 is more uniformly distributed between the upper face 22 of the component 20 and the end coupling face 122 of distal end (tip) portion 120.

Figure 5B:
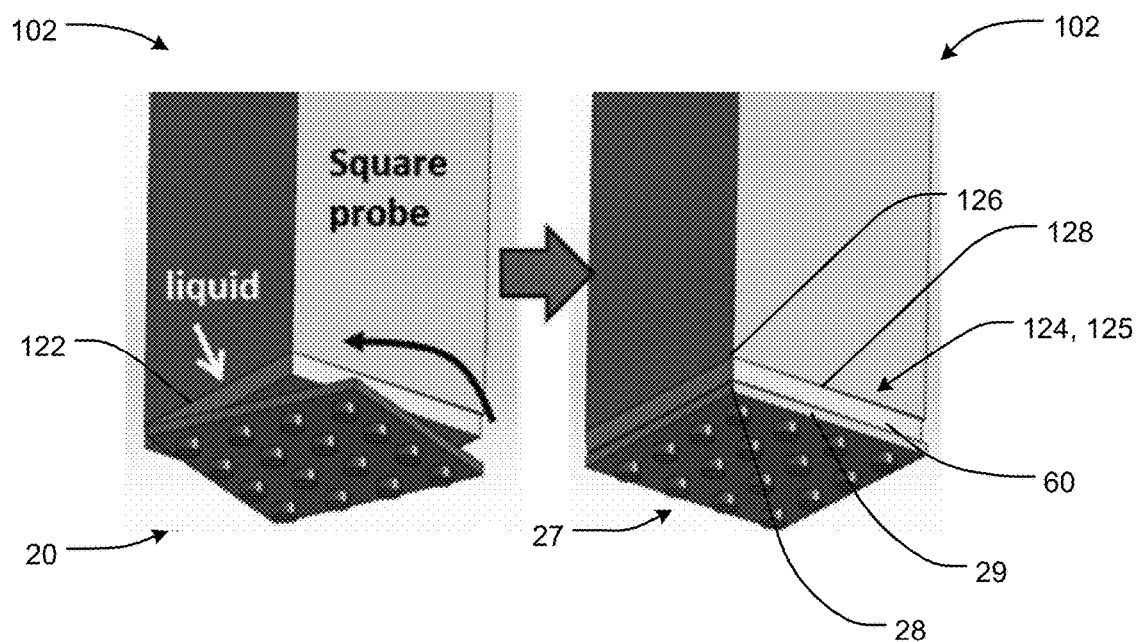
FIG. 5B shows the distal end (tip) portion of the exemplary assembly probe of FIG. 3A, with a polygonal (square)

Referring to FIG. 5B, in order to better repeatably orientate the component 20 relative to end coupling face 122 of the probe 100, the probe 100 may have a distal end (tip) portion 120, particularly end coupling face 122, with an outer contour 124 defined by at least one alignment feature 125 configured to align with a corresponding alignment feature 27 of the component 20. For example, the outer contour 124 of the end coupling face 122 of the probe 100 may include at least one corner 126 or at least one linear peripheral edge 128 configured to align with at least one corner 28 or at least one linear peripheral edge 29 of component 20. In such regard, the at least one corner 126 or at least one linear peripheral edge 128 of the outer contour 124 of the end coupling face 122 of the probe 100, and the at least one corner 28 or at least one linear peripheral edge 29 of the component 20, may be part of a polygonal shape with the polygonal shape of the end coupling face 122 and the component 20 being the same.

For example, in an exemplary embodiment, if the component 20 is a square, then the end coupling face 122 would be square to match the square length and width (x and y) dimension of the component 20. The same may be said for other polygonal shapes (e.g. triangular end coupling face for a triangular component face, square end coupling face for square component face, rectangular end coupling face for a rectangular component face, etc.).

The at least one corner 126 or at least one linear peripheral edge 128 of the end coupling face 122 of the probe 100 may self align automatically with at least one corner 28 or at least one linear peripheral edge 29 of the component 20 as shown in FIG. 5B. In doing so, the component 20 may rotate about the longitudinal axis LA of the assembly probe 100 such that the at least one corner 28 of the component 20 moves closer to the at least one corner 126 of the end coupling face 122 and/or the at least one linear peripheral edge 29 of the component 20 moves closer to the at least linear peripheral edge 128 of the end coupling face 122.

Without being bound to a particular theory, the fluid coupling droplet 60 may rotate the component 20 relative to the end coupling face 122 when the component 20 is coupled, as discussed above, or plausibly due to surface tension/capillary force effects.

Referring now to FIGS. 6A-6F, in addition to being able to change the size of the fluid coupling droplet 60, probe 100 may be arranged to change the shape, and hence the wettability, of at least a portion of the end coupling face 122, particularly with an electric field. More particularly, at least a portion of the end coupling face 122 may be formed of an electro-responsive composition 180, which will change the wettability of the end coupling face 122 in the presence of an electric field. As used herein, an electro-responsive composition may be understood as a material which exhibits a change in size shape when stimulated by an electric field.

The distal end (tip) portion 120 may include electrical conductors 160, 162, which may be formed of gold, silver or copper, and are part of an electric circuit coupled to electric power source 70. The electrical conductors 160, 162 may be embedded in an electrical (dielectric) material 170, such as glass. More particularly, the distal end (tip) portion 120 may include at least one pair of electrical conductors 160, 162 (e.g. electrically conductive traces) which may be electrically connectable to the electric power source 70 (e.g. AC). Each electrical conductor 160, 162 may be wired to the electric power source 70 to provide a first and second opposite (positive and negative) poles of an electrical circuit.

The electro-responsive composition 180 may be a polymer composition including at least one liquid crystal polymer (LCP). The at least one liquid crystal polymer may provide end coupling face 122 by forming the polymer composition containing the at least one liquid crystal polymer into a composite film. The film may be located on the distal end of the distal end (tip) portion, and electrically coupled to the embedded electrical conductors 160, 162. As may be understood in the art, an electric field may be used to change the orientation or texture of the electro-responsive composition 180, particularly by changing the shape of the composition 180.

More particularly, a voltage may be provided between the outer conductor 160 and the inner conductor 162, which creates in-plane alignment of the liquid crystal polymer. As known in the art, tunable wettability of a polymer composite film may originate from the reorientation of the anchored liquid-crystal molecules, which is switched by an in-plane electric field with squared pulses of voltages. See "Electrically tunable wettability of liquid crystal/polymer composite films", Lin et al., Optics Express, Vol. 16, No. 22, (2008), which is hereby incorporated by reference in its entirety.

Referring to FIGS. 6C and 6D, by changing the wettability of the end coupling face 122, the distribution of the fluid coupling droplet 60 may be changed. In FIG. 6C, the electric field has not been applied to the electro-responsive material of end coupling face 122, while in FIG. 6D, the electric field is shown being applied. As shown by FIG. 6D, when the wettability of the end coupling face 122 increased in the presence of an electric field (voltage), it may be understood that the contact angle of the fluid decreases and the fluid coupling droplet 60 covers a greater area of the end coupling face 122 in a more uniform manner.

Referring to FIG. 6E, linear or grid pattern electrical conductors (traces) may be used to from the fluid coupling droplet 60 into a rectangular shape, in order to reduce the initial orientation angle OA as discussed herein above.

Referring to FIG. 6F, the electro-responsive composition 180 may only be applied to a portion of the end coupling face 122. By applying an electric field (voltage) only to a portion of the end coupling face 122, the wettability of the end coupling face 122 in different regions of the end coupling face 122 may be changed, it may be understood that the contact angle θ of the fluid in the different regions will also vary, which may be used to control the form (shape) and position of the fluid coupling droplet 60 thereon, and thus the orientation of the component 20 on the end coupling face 122. For example, component 20 may be tilted such that the upper face 22 and/or lower face 24 of the component 20 is orientated at an orientation angle OA as discussed above herein. As shown, component 20 is tilted at an orientation angle OA of 15 degrees from the astronomical horizon AH, while the end coupling face 122 of the distal end (tip) portion 120 is orientated parallel to the astronomical horizon AH.

In general, an electrified distal (tip) portion 120 can be used with electro-responsive materials to change the form (shape) and positioning of the fluid coupling droplet 60 used to pick and place a component 20, as well as the change the capillary force. For example, when the surface of water is subjected to a strong electric field, water molecules very near the surface may become ordered in the electric field due to the polarity of the molecules. This change may result in a change in the surface tension of the water, which will change the capillary force.

Thus, changing the shape and/or the positioning of the fluid coupling droplet 60 on the end coupling face 122 of the assembly probe 100 may be performed at least in part by changing wetting of the end coupling face 122 of the assembly probe 100 by the fluid coupling droplet 60. More particularly, when the end coupling face 122 of the assembly probe 100 comprises a polymer composition including at least one liquid crystal polymer, changing the wetting of the end coupling face 122 of the assembly probe 100 by the fluid coupling droplet 60 may be performed by providing an electric field to the polymer composition.

Actively varying the form (shape) and position of the fluid coupling droplet 60 on the end coupling face 122 of the distal end (tip) portion 120 may also be accomplished by electrical conductors 160, 162 in the distal end (tip) portion 120 being used to create a magnetic field, and utilizing a fluid coupling droplet 60 formed of a ferrofluid.

A ferrofluid may be understood to be a colloidal liquid made of nanoscale ferromagnetic, or ferrimagnetic, particles suspended in a liquid carrier, with may be an organic solvent (i.e. solvent based ferrofluid) or water (aqueous based ferrofluid). As known in the art, when a ferrofluid is subjected to a magnetic field, the form (shape) of the fluid changes, typically forming peaks and valleys. As such, by subjecting the a fluid coupling droplet 60 of ferrofluid on the end coupling face 122 of the distal end (tip) portion 120 to various magnetic field shapes, such may be used to control the form (shape) and positioning of the fluid coupling droplet 60 thereon, and thus the orientation of the component 20 on the end coupling face 122.

Referring to FIGS. 7A and 7B, by changing the wettability of the ferrofluid, the distribution of the fluid coupling droplet 60 may be changed. In FIG. 7A, the magnetic field has not been applied to the ferrofluid coupling droplet 60, while in FIG. 7B, the magnetic field is shown being applied. As shown by FIG. 7B, when the wettability of the ferrofluid decreased in the presence of the magnetic field, it may be understood that the contact angle of the ferrofluid increases and the fluid coupling droplet 60 covers a smaller area of the end coupling face 122. Without being bound to a particular theory, when the ferrofluid coupling droplet 60 is exposed to a magnetic field, the ferrofluid aligns with the resulting magnetic induction, thereby contracting and changing the contact angle.

Referring to FIG. 7C, linear or grid pattern electrical conductors (traces) may be used to from the ferrofluid coupling droplet 60 into a rectangular shape, in order to reduce the initial orientation angle OA as discussed herein above.

Referring to FIG. 7D, the magnetic field may only be applied to a portion of the end coupling face 122. By applying a magnetic field only to a portion of the end coupling face 122, the wettability of the end ferrofluid coupling droplet 60 in different regions of the end coupling face 122 may be changed, it may be understood that the contact angle θ of the fluid in the different regions will also vary, which may be used to control the form (shape) and position of the ferrofluid coupling droplet 60 thereon, and thus the orientation of the component 20 on the end coupling face 122.

Thus, changing the shape and/or the positioning of the fluid coupling droplet 60 on the end coupling face 122 of the assembly probe 100 may be performed at least in part by applying a magnetic field to the fluid coupling droplet 60, particularly when the fluid coupling droplet 60 is formed of a ferrofluid.

The following examples pertain to further embodiments, from which numerous permutations and configurations will be apparent.

Example 1 discloses a method of assembly, comprising providing an assembly probe, the assembly probe having an end coupling face; providing a droplet of fluid on the end coupling face of the assembly probe; coupling an electronic component to the end coupling face of the assembly probe with the fluid droplet, the electronic component having a peripheral dimension equal to or less than 2 mm in each of length, width and height; placing the electronic component on a substrate with the assembly probe; decoupling the electronic component from the end coupling face of the assembly probe; and assembling the electronic component to the substrate.

Example 2 discloses the subject matter of Example 1, wherein the assembly probe comprises a first member and a second member; the end coupling face of the assembly probe is provided by the first member; and further comprising placing the electronic component on the substrate with the first member; placing the second member in contact with the electronic component; and moving the first member relative to the second member and/or the second member relative to the first member to decouple the electronic component from the end coupling face of the assembly probe.

Example 3 discloses the subject matter of Example 2, wherein the first member is an inner member of the assembly probe; and the second member is an outer member of the assembly probe.

Example 4 discloses the subject matter of Example 3, wherein the inner member of the assembly probe is cylindrical; the second member of the assembly probe is cylindrical; and the cylindrical inner member is located within the cylindrical outer member.

Example 5 discloses the subject matter of Example 1, wherein decoupling the electronic component from the end coupling face of the assembly probe includes at least one of separating the fluid droplet from the end coupling face of the assembly probe; separating the fluid droplet from the electronic component; separating the fluid droplet into a first portion coupled to the end coupling face of the assembly probe and a second portion coupled to the electronic component; and at least partially evaporating the fluid droplet.

Example 6 discloses the subject matter of Example 1, further comprising, after the electronic component is coupled to the end coupling face of the assembly probe with the fluid droplet, changing an orientation of the electronic component on the assembly probe prior to placing the electronic component on a substrate.

Example 7 discloses the subject matter of Example 6, wherein changing the orientation of the electronic component on the assembly probe is performed at least in part by changing a size, shape and/or positioning of the fluid droplet on the end coupling face of the assembly probe.

Example 8 discloses the subject matter of Example 7, wherein changing the size of the fluid droplet on the end coupling face of the assembly probe comprises increasing the size of the fluid droplet by adding fluid to the fluid droplet.

Example 9 discloses the subject matter of Example 7, wherein the fluid droplet wets the end coupling face of the assembly probe; and changing the shape and/or the positioning of the fluid droplet on the end coupling face of the assembly probe is performed at least in part by changing wetting of the end coupling face of the assembly probe by the fluid droplet.

Example 10 discloses the subject matter of Example 9, wherein the end coupling face of the assembly probe comprises a polymer composition including at least one liquid crystal polymer; and changing the wetting of the end coupling face of the assembly probe by the fluid droplet is performed by providing an electric field to the polymer composition.

Example 11 discloses the subject matter of Example 7, wherein the fluid droplet is formed of a ferrofluid; and changing the shape and/or the positioning of the fluid droplet on the end coupling face of the assembly probe is performed at least in part by applying a magnetic field to the ferrofluid.

Example 12 discloses the subject matter of Example 1, wherein the end coupling face is defined by at least one of a corner and a linear peripheral edge.

Example 13 discloses the subject matter of Example 12, wherein the assembly probe has a longitudinal axis; the electronic component has at least one of a corner and a linear peripheral edge; and further comprising rotating the electronic component about the longitudinal axis of the assembly probe such that the at least one corner of the electronic component is closer to the at least one corner of the end coupling face and/or the at least one linear peripheral edge of the electronic component is closer to the at least linear peripheral edge of the end coupling face.

Example 14 discloses the subject matter of Example 12, wherein the end coupling face is defined by a polygonal shape.

Example 15 discloses the subject matter of Example 14, wherein the electronic component has a polygonal shape which matches the polygonal shape of the end coupling face.

Example 16 discloses the subject matter of Example 14, wherein the polygonal shape is a rectangle.

Example 17 discloses the subject matter of Example 1, wherein the assembly probe includes at least one fluid passage coupled to at least one fluid outlet arranged to provide the droplet of fluid on the end coupling face of the assembly probe.

Example 18 discloses an apparatus comprising an assembly probe configured to assemble an electronic component to a substrate; wherein the electronic component has a peripheral dimension equal to or less than 2 mm in each of length, width and thickness; wherein the assembly probe has a distal end tip portion with an end coupling face arranged to receive a fluid droplet thereon, and to couple to the electronic component with the fluid droplet; and wherein the end coupling face is defined by at least one of a corner and a linear peripheral edge Example 19 discloses the subject matter of Example 18, wherein the end coupling face is defined by a polygonal shape.

Example 20 discloses the subject matter of Example 18, wherein the assembly probe comprises a distal end tip portion; the distal end tip portion includes at least one electrical contact; and the at least one electrical contact arranged to provide an electric field to the end coupling face to change a wettability of the end coupling face and/or arranged to provide a magnetic field at the end coupling face.

Example 21 discloses the subject matter of Example 18, wherein the assembly probe comprises a first member and a second member; the end coupling face of the assembly probe is provided by the first member; and the second member is arranged to operate in conjunction with the first member to decouple the electronic component from the end coupling face of the assembly probe.

Example 22 discloses the subject matter of Example 21, wherein the first member is an inner member of the assembly probe; and the second member is an outer member of the assembly probe.

Example 23 discloses the subject matter of Example 22, wherein the inner member of the assembly probe is cylindrical; the second member of the assembly probe is cylindrical; and the cylindrical inner member is located within the cylindrical outer member.

Example 24 discloses a non-transitory computer-readable medium having a plurality of instructions encoded thereon that when executed by at least one processor cause a process to be carried out, the process being configured to cause an assembly probe to operate, the assembly probe having an end coupling face; cause a droplet of fluid to be provide on the end coupling face of the assembly probe; cause an electronic component to be coupled to the end coupling face of the assembly probe with the fluid droplet, the electronic component having a peripheral dimension equal to or less than 2 mm in each of length, width and height; cause the electronic component to be placed on a substrate with the assembly probe; cause the electronic component to be decoupled from the end coupling face of the assembly probe; and cause the electronic component to be assembled to the substrate.

While a preferred embodiment of the present invention(s) has been described, it should be understood that various changes, adaptations and modifications can be made therein without departing from the spirit of the invention(s) and the scope of the appended claims. The scope of the invention(s) should, therefore, be determined not with reference to the above description, but instead should be determined with reference to the appended claims along with their full scope of equivalents. Furthermore, it should be understood that the appended claims do not necessarily comprise the broadest scope of the invention(s) which the applicant is entitled to claim, or the only manner(s) in which the invention(s) may be claimed, or that all recited features are necessary.

What is claimed is:

1. A method of assembly, comprising:
providing an assembly probe, the assembly probe having an end coupling face;
providing a droplet of fluid on the end coupling face of the assembly probe;
coupling an electronic component to the end coupling face of the assembly probe with the fluid droplet, the electronic component having a peripheral dimension equal to or less than 2 mm in each of length, width and height;
placing the electronic component on a substrate with the assembly probe;
decoupling the electronic component from the end coupling face of the assembly probe; and
assembling the electronic component to the substrate;
wherein:
the assembly probe comprises a first member and a second member;
the end coupling face of the assembly probe is provided by the first member; and
the method further comprises
placing the electronic component on the substrate with the first member;
placing the second member in contact with the electronic component; and
moving the first member relative to the second member and/or the second member relative to the first member to decouple the electronic component from the end coupling face of the assembly probe.

2. The method of claim 1, wherein:
the first member is an inner member of the assembly probe; and
the second member is an outer member of the assembly probe.

3. The method of claim 2, wherein:
the inner member of the assembly probe is cylindrical;
the second member of the assembly probe is cylindrical; and
the cylindrical inner member is located within the cylindrical outer member.

4. The method of claim 1, wherein:
the end coupling face comprises at least one of a corner and a linear peripheral edge.

5. The method of claim 4, wherein:
the assembly probe has a longitudinal axis;
the electronic component has at least one of a corner and a linear peripheral edge; and further comprising
rotating the electronic component about the longitudinal axis of the assembly probe such that the at least one corner of the electronic component is closer to the at least one corner of the end coupling face and/or the at least one linear peripheral edge of the electronic component is closer to the at least linear peripheral edge of the end coupling face.

6. The method of claim 4, wherein:
the end coupling face is defined by a polygonal shape.

7. The method of claim 6, wherein:
the electronic component has a polygonal shape which matches the polygonal shape of the end coupling face.

8. The method of claim 6, wherein:
the polygonal shape is a rectangle.

9. The method of claim 1, wherein:
the assembly probe includes at least one fluid passage coupled to at least one fluid outlet arranged to provide the droplet of fluid on the end coupling face of the assembly probe.

10. A method of assembly, comprising:
providing an assembly probe, the assembly probe having an end coupling face;
providing a droplet of fluid on the end coupling face of the assembly probe;
coupling an electronic component to the end coupling face of the assembly probe with the fluid droplet, the electronic component having a peripheral dimension equal to or less than 2 mm in each of length, width and height;
placing the electronic component on a substrate with the assembly probe;
decoupling the electronic component from the end coupling face of the assembly probe;
assembling the electronic component to the substrate; and
after the electronic component is coupled to the end coupling face of the assembly probe with the fluid droplet, changing an orientation of the electronic component on the assembly probe prior to placing the electronic component on a substrate.

11. The method of claim 10 wherein:
changing the orientation of the electronic component on the assembly probe is performed at least in part by changing a size, shape and/or positioning of the fluid droplet on the end coupling face of the assembly probe.

12. The method of claim 11 wherein:
changing the size of the fluid droplet on the end coupling face of the assembly probe comprises increasing the size of the fluid droplet by adding fluid to the fluid droplet.

13. The method of claim 11 wherein:
the fluid droplet wets the end coupling face of the assembly probe; and
changing the shape and/or the positioning of the fluid droplet on the end coupling face of the assembly probe is performed at least in part by changing wetting of the end coupling face of the assembly probe by the fluid droplet.

14. The method of claim 13 wherein:
the end coupling face of the assembly probe comprises a polymer composition including at least one liquid crystal polymer; and
changing the wetting of the end coupling face of the assembly probe by the fluid droplet is performed by providing an electric field to the polymer composition.

15. The method of claim 11 wherein:
the fluid droplet is formed of a ferrofluid; and
changing the shape and/or the positioning of the fluid droplet on the end coupling face of the assembly probe is performed at least in part by applying a magnetic field to the ferrofluid.

16. A method of assembly, comprising:
providing an assembly probe, the assembly probe having an end coupling face;
providing a droplet of fluid on the end coupling face of the assembly probe;
coupling an electronic component to the end coupling face of the assembly probe with the fluid droplet, the electronic component having a peripheral dimension equal to or less than 2 mm in each of length, width and height;
placing the electronic component on a substrate with the assembly probe;
decoupling the electronic component from the end coupling face of the assembly probe; and
assembling the electronic component to the substrate;
decoupling the electronic component from the end coupling face of the assembly probe includes at least one of:
separating the fluid droplet from the end coupling face of the assembly probe;
separating the fluid droplet from the electronic component;

separating the fluid droplet into a first portion coupled to the end coupling face of the assembly probe and a second portion coupled to the electronic component; and at least partially evaporating the fluid droplet.

* * * * *